United States Patent [19]

Sniegocki

[11] Patent Number: 5,782,687

[45] Date of Patent: Jul. 21, 1998

[54] SECURITY COVER FOR FAX MACHINE

[76] Inventor: James Sniegocki, 8901 Blossom La., Louisville, Ky. 40242

[21] Appl. No.: 779,655

[22] Filed: Jan. 15, 1997

[51] Int. Cl.$^6$ .................................................. H05K 5/00
[52] U.S. Cl. .......................... 454/184; 361/690; 361/692; 174/16.1
[58] Field of Search .................. 454/184; 174/16.1, 174/50; 361/690, 692, 694, 695

[56] References Cited

U.S. PATENT DOCUMENTS

| | | |
|---|---|---|
| 2,639,605 | 5/1953 | Knutson . |
| 3,617,608 | 11/1971 | Wisniewski .................. 174/37 |
| 4,613,109 | 9/1986 | Boscacci ..................... 248/553 |
| 4,738,428 | 4/1988 | Themistos et al. ............ 248/551 |
| 4,772,759 | 9/1988 | Roy et al. ................. 174/17 VA |
| 4,825,670 | 5/1989 | Snow . |
| 5,417,488 | 5/1995 | Horton . |
| 5,526,929 | 6/1996 | Wei ........................... 206/378 |
| 5,533,797 | 7/1996 | Gelber . |

*Primary Examiner*—Harold Joyce
*Assistant Examiner*—Derek S. Boles
*Attorney, Agent, or Firm*—Middleton & Reutlinger; Charles G. Lamb

[57] ABSTRACT

A security device for a facsimile machine includes a base member upon which the facsimile machine is received and a cover mountable onto the base member and covering the facsimile machine. The base member and the cover are provided with mating tongue and groove sections, the tongue sections of the cover being provided with longitudinal extending through-bores and the tongue sections of the base member being provided with longitudinally extending channels in alignment with the through-bores in the tongue sections of the cover. A U-shaped locking bar is provided with outwardly extending L-shaped locking arms on opposed legs of the locking bar wherein the L-shaped arms are received within the channels of the base member and engageable with the through-bores in the tongues of the cover.

11 Claims, 3 Drawing Sheets

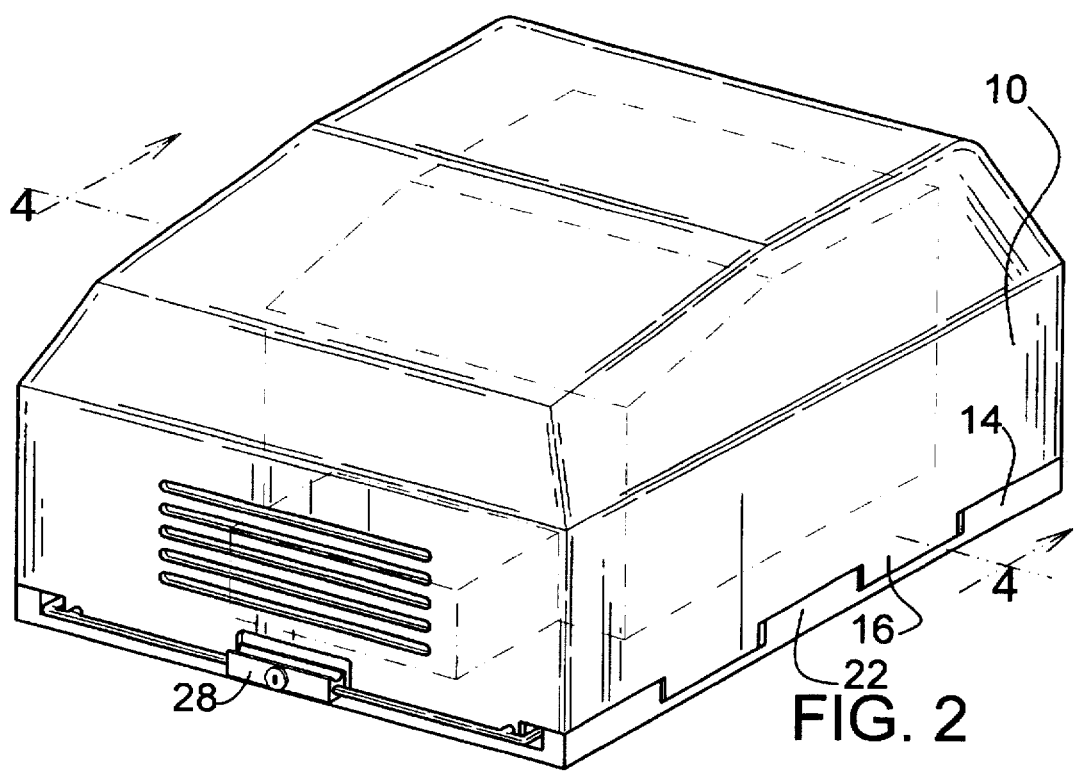
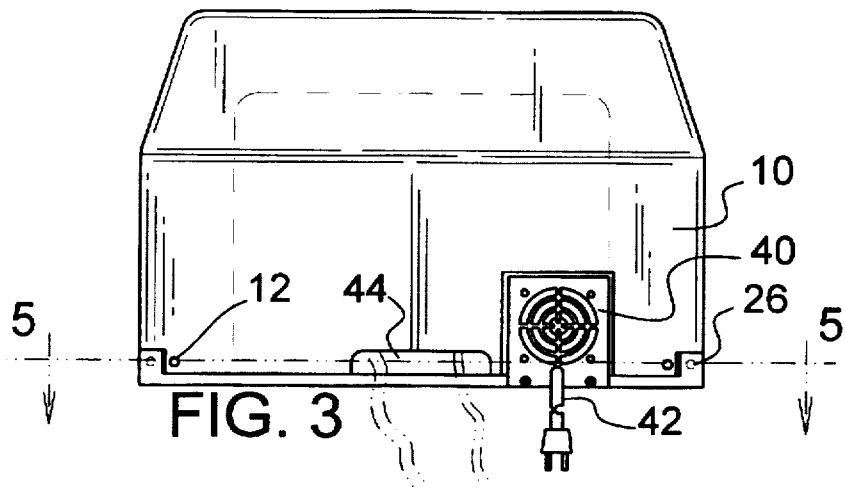
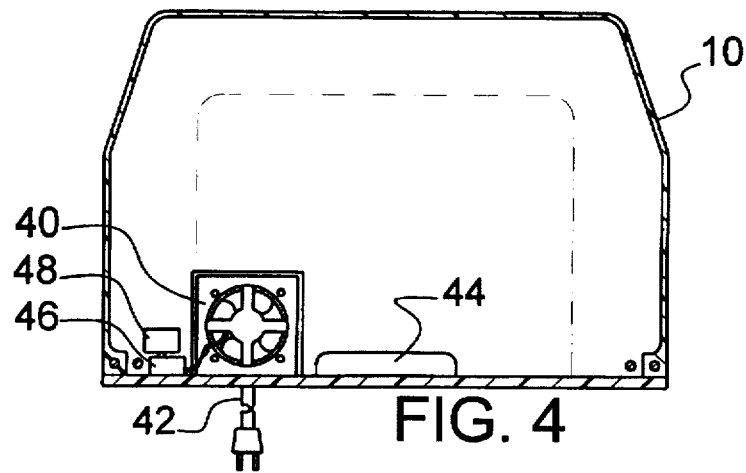

SECURITY COVER FOR FAX MACHINE

BACKGROUND OF THE INVENTION

This invention relates to security devices and more particularly for a security device for facsimile machines.

Security officials for departments of the government, companies, and the like have generally been concerned about the security of information sent and received through facsimile machines as facsimile or fax machines have become an integral part of sending and receiving information in every day business. The reason for the concern is that fax machines are generally located in secretarial or administrative areas of an office and usually are kept on at all times since many messages are received by the fax machines after working hours. Thus, major security concern arises when a fax containing sensitive information is received during these non-business hours. These communicating papers known as faxes sit on the machines during these non-business hours and are available to cleaning personnel, contractors, and even employees who may not be authorized to receive the particular information on the faxes. Moreover, the faxes received during the non-business hours can easily be stolen, copied or read without the knowledge of the sender or receiver of the fax transmission.

SUMMARY OF THE INVENTION

An object of the present invention is to provide a security device for fax communications received by a facsimile machine.

Another object of this invention is to provide a security device for receipt of fax transmissions during non-business hours.

A further object of the present invention is to provide a security device for a fax machine which is relatively inexpensive and easy to operate.

Particularly, the present invention provides a security device for a facsimile machine comprising: a base member, a cover, and a locking bar engageable with the base member and the cover with a fax machine covered by the cover in a secured position. More particularly, the base member is provided with alternating tongue and groove sections along opposed sides of the base member in mating relation with alternating tongue and groove sections of the cover and the locking bar is provided with movable locking means engageable with channels or grooves in selected portions of said tongues of said base member and said cover.

Further objects and advantages of this invention will become apparent from the following description and appended claims, reference being had to the accompanying drawings forming a part of the specification wherein like reference characters designate corresponding parts into several views.

DESCRIPTION OF THE DRAWINGS

FIG. 2 is a perspective view of the preferred security device of FIG. 1;

FIG. 3 is a back view of the security device of FIG. 1;

FIG. 4 is a sectional view taken along the line 4—4 of FIG. 2;

DESCRIPTION OF THE PREFERRED EMBODIMENT

Figure 1:
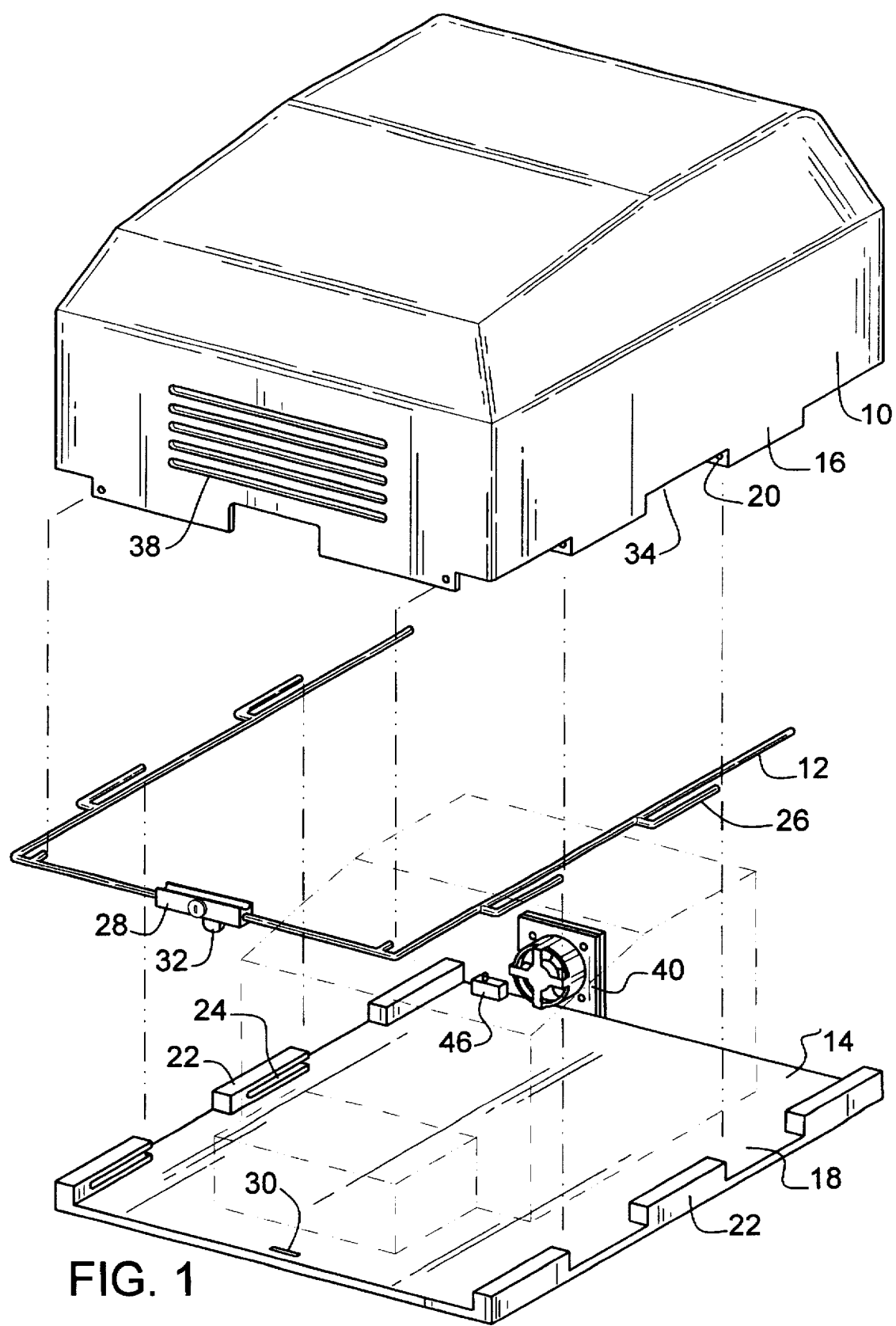
FIG. 1 is an exploded view of one preferred security device of the present invention.

As best shown in FIG. 1, a security device of the present invention is comprised of a cover 10, base member 14 and a U-shaped locking bar 12. The cover 10 is provided with alternating tongues 16 and grooves 34 along its lower terminating edge on opposed sides in mating relation with alternating tongues 36 and grooves 18 on opposed sides of the base member 14. The tongues 16 are provided with elongated through-bores 20 therethrough for receiving L-shaped arm portions 26 of the locking bar 12. The base member 14 is also provided with means to receive the L-shaped arms 26 and as shown in FIG. 1 the means to receive L-shaped arms 26 are channel-shaped portions 24 extending longitudinally from one end of tongues 22 a distance less than the width of the tongues 22.

The U-shaped locking bar 12 is also provided with a prior art key operated lock 28 and a movable latch member 32 operable in response to movement of a key (not shown) within the lock 28. Base member 14 is provided with a slot 30 therein to receive the movable latch member 32.

Also as shown in FIG. 1, the base member 14 is provided with a blower 40 which is actuated in response to switch 46 when the cover 10 is positioned onto the base member 46, a tab 48 (FIG. 4) engages the switch 46 and the fan 40 is energized. Moreover, an air vent 38 is also included in the cover 10 to provide an outlet for the air generated within the security device by the blower 40.

As shown in FIG. 2, the cover 10 is placed in a secured position over the facsimile machine shown in phantom lines. Moreover, the mating relationship between the tongue and groove portions of the cover 10 and the base member 14 are also shown.

As best shown in FIGS. 3 and 4, the back of the cover 10 is provided with a slot 44 therein which is used for easy access of electrical supply means to the fax machine when sealed under the cover 10. Moreover, as best shown in FIG. 4, the cover 10 is provided with the inwardly extending tab member 48 which is engageable with the switch 46 when the cover 10 is positioned onto the base member 14. The switch 46 closes the circuit to the blower for the blower 40. Moreover, as shown, a blower plug 42 is also provided for supplying the electrical energy to the blower motor.

Figure 5:
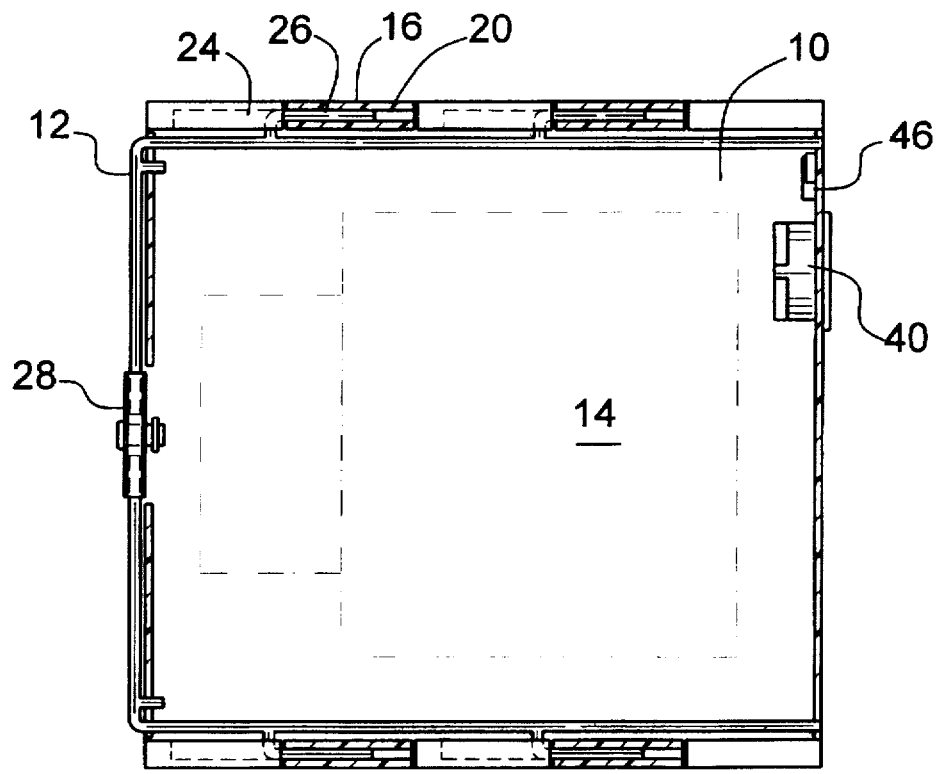
FIG. 5 is a sectional view taken along the line 5—5 of FIG. 3 showing the security device in a secured position; and, Fig. 5A is a sectional view taken along the line 5—5 of FIG. 3 showing the security device in an unsecured position.

As shown in FIG. 5, the cover 10 is placed securely upon the base member 14 wherein L-shaped engaging arms 26 of the latching bar 12 are partially received within the channels 24 of the base member 14 and the through-bores 20 of the tongues 16 of the cover 10.

Figure 5A:
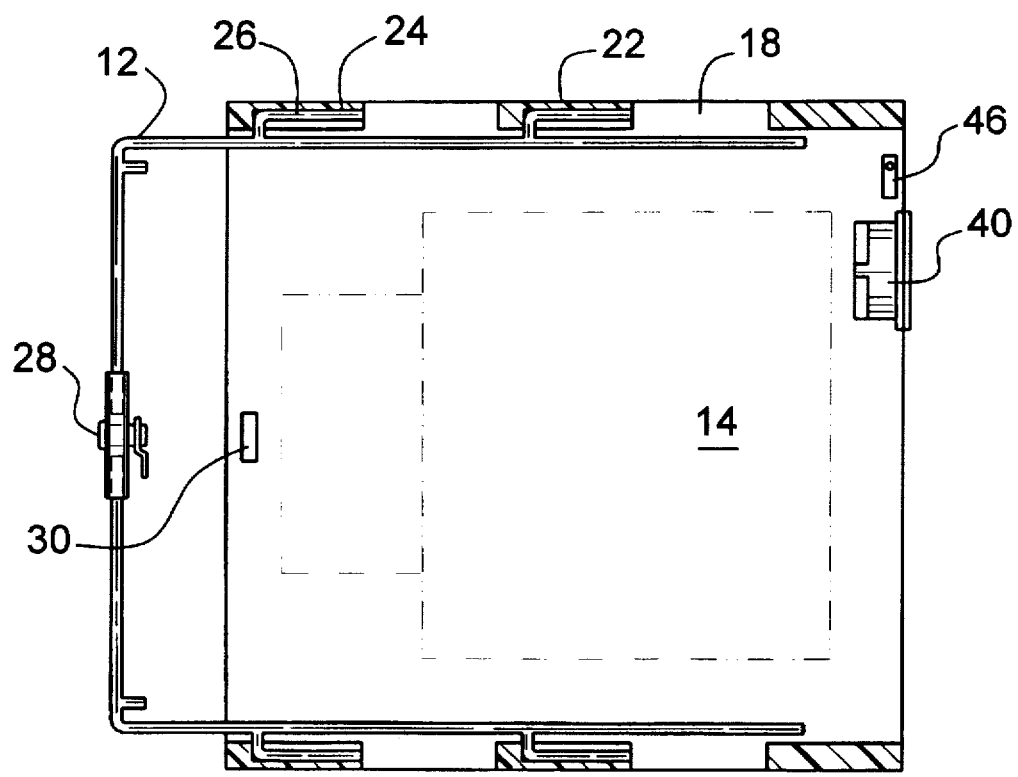

As shown in Fig. 5A, cover 10 is removed and the L-shaped locking arms 26 are recessed further into the channels 24 so that the cover 10 and particularly the tongue portions 16 are no longer engaged by the L-shaped latching arms 26.

In the operation of the security device of the present invention, the base member 14 is placed upon a table, desk or the like upon which a fax machine is to be located. The fax machine is placed upon the base member 14 and used under normal operating conditions. The U-shaped latching bar 12 is placed upon the base member and the L-shaped latching arms 26 are positioned within the channels 24 as shown in FIG. 5A thereby leaving the grooved portions 18 unobstructed. At the end of the business day or at other times when an appropriate attendant is not available for the fax machine, the cover 10 is then placed onto the base member 14 with the tongues and grooves 16 and 34 of cover 10 being placed in mating relation with the tongues and grooves 22 and 18 of the base member 14. The U-shaped locking bar 12 is then pushed rearwardly so that the L-shaped arm 26 engages with the through-bores 20. With each locking arm 26 being held within a channel 24 of the base member 14 and an aligned through-bore 20 of the cover 10, the cover 10 is secured to the base member 14 thereby enclosing the fax machine. A key is then inserted into the lock 28 whereby the movable latch portion 32 engages with the slot 30 and the cover 10 is secured to the base member 14.

In the construction of a security device of the present invention, the cover 10 is generally made of a material which is non-transparent. For example, one preferred cover is made of a smoked plexiglass or other colored plastic material whereby the fax transmissions received on the fax machine are not reachable through the cover. Base member 14 may also be made of a hard plastic material and the U-shaped locking bar is generally made of a hard plastic or mild steel.

It is realized that various changes in the details, materials of construction, steps and arrangement of parts which have been described herein and shown in the drawings in order to explain the nature of the invention, may be made by those skilled in the art without departing from the principals and scope of the invention as expressed in the claims appended hereto.

What is claimed is:

1. A security device for a facsimile machine comprising:
   a base member having alternating tongue and groove sections at selected locations along opposed sides of the base member;
   a cover having alternating tongue and groove sections along opposed sides of a lower terminating edge of the cover, said tongue and groove sections of said cover being in mating relation with said base member tongue and groove section; and,
   a locking bar having means engageable with the tongue sections of the base member and cover whereby upon engagement with the tongue sections of the base member and the cover, the cover is secured to the base member.

2. The security device of claim 1 wherein the tongues of said base member include longitudinally extending through-bores in alignment with channel members in said tongues of said base member, said channels extending less than the width of said tongue, said locking bar having locking arms movably engageable with said through-bores and said channels.

3. The security device of claim 1, said locking bar having a lock and said base member having means to receive a movable latch of said lock.

4. The security device of claim 1, said cover having air vent means and said base member having a blower at an opposed end of said base portion from said air vent means in said cover.

5. The security device of claim 4, said cover having means to engage a switch on said base member, said switch being in energizing relation with said blower.

6. The security device of claim 1, said cover being a smoked plexiglass.

7. In combination with a facsimile machine, a security device having a base member and a cover over said facsimile machine, the improvement comprising:
   said base member having alternating tongue and groove sections at selected locations along opposed sides of the base member;
   said cover having alternating tongue and groove sections along opposed sides of a lower terminating edge of the cover, said tongue and groove sections of said cover being in mating relation with said base member tongue and groove section; and,
   a locking bar having means engageable with the tongue sections of said base member and said cover whereby upon engagement with the tongue sections of the base member and the cover, the cover is secured to the base member.

8. The combination of claim 7 wherein the tongues of said base member include longitudinally extending through-bores in alignment with channel members in said tongues of said base member, said channels extending less than the width of said tongues, said locking bar having locking arms movably engageable with said through-bores and said channels.

9. The combination of claim 7, said locking bar having a lock and said base member having means to receive a movable latch of said lock.

10. The combination of claim 7, said cover having air vent means and said base member having a blower at an opposed end of said base portion from said air vent means in said cover.

11. The combination of claim 10, said cover having means to engage a switch on said base member, said switch being in energizing relation with said blower.

\* \* \* \* \*